(12) United States Patent
Han

(10) Patent No.: US 12,707,818 B2
(45) Date of Patent: Aug. 11, 2026

(54) DISPLAY DEVICE AND METHOD FOR MANUFACTURING THE SAME

(71) Applicant: Samsung Display Co., Ltd., Yongin-si (KR)

(72) Inventor: Seul Gi Han, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 17/833,828

(22) Filed: Jun. 6, 2022

(65) Prior Publication Data

US 2023/0109244 A1 Apr. 6, 2023

(30) Foreign Application Priority Data

Sep. 29, 2021 (KR) ........................ 10-2021-0128853

(51) Int. Cl.
*H10K 59/122* (2023.01)
*H10K 71/00* (2023.01)
*H10K 59/12* (2023.01)

(52) U.S. Cl.
CPC ........... *H10K 59/122* (2023.02); *H10K 71/00* (2023.02); *H10K 59/1201* (2023.02)

(58) Field of Classification Search
CPC ............... H10D 84/834; H10D 30/024; H10D 30/6211; H10D 84/0128; H10D 84/0158; H10D 84/038; H10D 84/83; H10D 88/00; H10D 88/01; H01L 23/5226; H01L 23/5283
See application file for complete search history.

(56) References Cited

U.S. PATENT DOCUMENTS

| | | | | |
|---|---|---|---|---|
| 9,614,191 | B2 | 4/2017 | Madigan | |
| 9,761,801 | B2 | 9/2017 | Kang | |
| 2011/0233572 | A1* | 9/2011 | Nakatani | H10K 59/122 257/88 |
| 2015/0144902 | A1* | 5/2015 | Do | H10K 59/80522 257/40 |
| 2019/0386253 | A1* | 12/2019 | Li | H10K 59/8792 |
| 2021/0335907 | A1 | 10/2021 | Xie et al. | |
| 2022/0013607 | A1* | 1/2022 | Lee | H10K 59/121 |

(Continued)

FOREIGN PATENT DOCUMENTS

| | | |
|---|---|---|
| CN | 109713007 | 5/2019 |
| CN | 111483235 | 8/2020 |
| KR | 10-2014-0074629 | 6/2014 |

(Continued)

OTHER PUBLICATIONS

Korean Office Action dated Mar. 6, 2025, in Korean Patent Application No. 10-2021-0128853.

*Primary Examiner* — Britt Hanley
*Assistant Examiner* — William C. Trice, III
(74) *Attorney, Agent, or Firm* — Lerner David LLP

(57) ABSTRACT

A display device includes: a substrate; a plurality of first electrodes positioned on the substrate; a lower partition wall configured to include a plurality of pixel openings that overlap the first electrodes; an outer partition wall positioned on at least a portion of the lower partition wall; an inner partition wall positioned on another portion of the lower partition wall; an emission layer disposed on each of the first electrodes; and a second electrode disposed on the emission layer.

10 Claims, 22 Drawing Sheets

(56) References Cited

U.S. PATENT DOCUMENTS

2022/0052032 A1* 2/2022 Li ........................ H01L 21/467
2023/0035136 A1* 2/2023 Lin ..................... H10K 59/122

FOREIGN PATENT DOCUMENTS

KR 10-2018-0013181 2/2018
KR 10-1921374 11/2018
KR 10-2019-0053295 5/2019

* cited by examiner

FIG. 8

PXGr
PX2
PX1
PX4
PX3
355
357

DISPLAY DEVICE AND METHOD FOR MANUFACTURING THE SAME

CROSS-REFERENCE TO RELATED APPLICATION

This application claims priority from and the benefit of Korean Patent Application No. 10-2021-0128853, filed Sep. 29, 2021, which is hereby incorporated by reference for all purposes as if fully set forth herein.

BACKGROUND

Field

Embodiments and implementations of the invention relate generally to a display device and a manufacturing method thereof.

Discussion of the Background

A display device serves to display an image and/or text on a screen, and includes a liquid crystal display, an organic light emitting diode display, and the like. Such a display device is used in various electronic devices such as mobile phones, navigation units, digital cameras, electronic books, portable game machines, and various terminals.

Such a display device may be formed by stacking a plurality of layers, and various methods may be used to pattern these layers. For example, a photo and etching process, a chemical mechanical polishing process, an inkjet printing process, and the like may be used.

Among them, the inkjet printing process is a method of forming a predetermined pattern by discharging fine droplets of ink to a desired position. For example, an emission layer of an organic light emitting diode display may be formed by using an inkjet printing process. The organic light emitting diode display may include a plurality of pixels, each of the pixels may be separated by a pixel defining layer, and droplets may be discharged into an opening of the pixel defining layer to form an emission layer.

In this case, the inkjet printing process may be performed by matching at least one nozzle to each pixel. In a high-resolution display device, as a size of each pixel is reduced, high performance of an inkjet head and ink are required. Accordingly, technical difficulty increases and a cost increases.

The above information disclosed in this Background section is only for understanding of the background of the inventive concepts, and, therefore, it may contain information that does not constitute prior art.

SUMMARY

Embodiments have been made in an effort to reduce technical difficulties and costs when forming a predetermined layer on a device by an inkjet printing process.

Additional features of inventive concepts consistent with embodiments of the invention will be set forth in the description that follows, and in part will be apparent from the description, or may be learned by practice of the inventive concepts.

An embodiment provides a display device including: a substrate; a plurality of first electrodes positioned on the substrate; a lower partition wall configured to include a plurality of pixel openings that overlap the plurality of first electrodes; an outer partition wall positioned on at least a portion of the lower partition wall; an inner partition wall positioned on another portion of the lower partition wall; an emission layer disposed on each of the first electrodes; and a second electrode disposed on the emission layer.

The inner partition wall may be surrounded by the outer partition wall.

The outer partition wall may include a material that is different from that of the inner partition wall.

Surface energy of the outer partition wall may be lower than surface energy of the inner partition wall.

A contact angle of the outer partition wall may be higher than that of the inner partition wall.

The contact angle of the outer partition wall may be 50 degrees or more, and the contact angle of the inner partition wall may be greater than or equal to 40 degrees and less than 50 degrees.

A thickness of the inner partition wall may be thicker than that of the outer partition wall.

The substrate may include a pixel group including a plurality of pixels, the outer partition wall may have a shape surrounding the pixel group, and the inner partition wall may be positioned between the pixels positioned in the pixel group.

The outer partition wall may be formed to have a rectangular shape in a plan view, and the inner partition wall may have formed to have a cross shape in a plan view.

The emission layer may include an individual emission layer, and a common layer positioned at an upper side or a lower side of the individual emission layer.

An embodiment provides a manufacturing method of a display device, the method including: forming a plurality of first electrodes on a substrate; forming a lower partition wall on the first electrodes, and forming a plurality of pixel openings in the lower partition wall to overlap the plurality of first electrodes; forming an outer partition wall on at least a portion of the lower partition wall; forming an inner partition wall on another portion of the lower partition wall; forming an emission layer in the pixel electrodes; and forming a second electrode on the emission layer.

The forming of the emission layer may include forming a common layer, and forming an individual emission layer.

The common layer may be formed by dripping ink to correspond to the inner partition wall in the forming of the common layer, and an ink may be dripped to correspond to each of the pixel openings to form the individual emission layer in the forming of the individual light emitting layer.

The substrate may include a pixel group including a plurality of pixels, the outer partition wall may have a shape surrounding the pixel group, and the inner partition wall may be positioned between the pixels positioned in the pixel group.

The pixel group may include a first pixel and a second pixel displaying different colors, and a common layer positioned in the first pixel and a common layer positioned in the second pixel may be made of a same material, and an individual emission layer positioned on the first pixel and an individual emission layer positioned on the second pixel may be made of different materials.

The inner partition wall may be surrounded by the outer partition wall.

The outer partition wall may include a material that is different from that of the inner partition wall.

Surface energy of the outer partition wall may be lower than surface energy of the inner partition wall.

A contact angle of the outer partition wall may be higher than that of the inner partition wall.

A thickness of the inner partition wall may be thicker than that of the outer partition wall.

According to the embodiments, when forming an emission layer by an inkjet printing process, at least some of layers constituting the emission layer may be formed by performing one discharge on a plurality of pixels, thereby reducing technical difficulty and cost.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIG. 8 to FIG. 12 illustrate perspective or cross-sectional views sequentially illustrating a process of forming some layers of a display device according to an embodiment.

FIG. 17 to FIG. 20 illustrate perspective or cross-sectional views showing various examples of a first interlayer insulating layer of a display device according to an embodiment.

DETAILED DESCRIPTION

Figure 1:
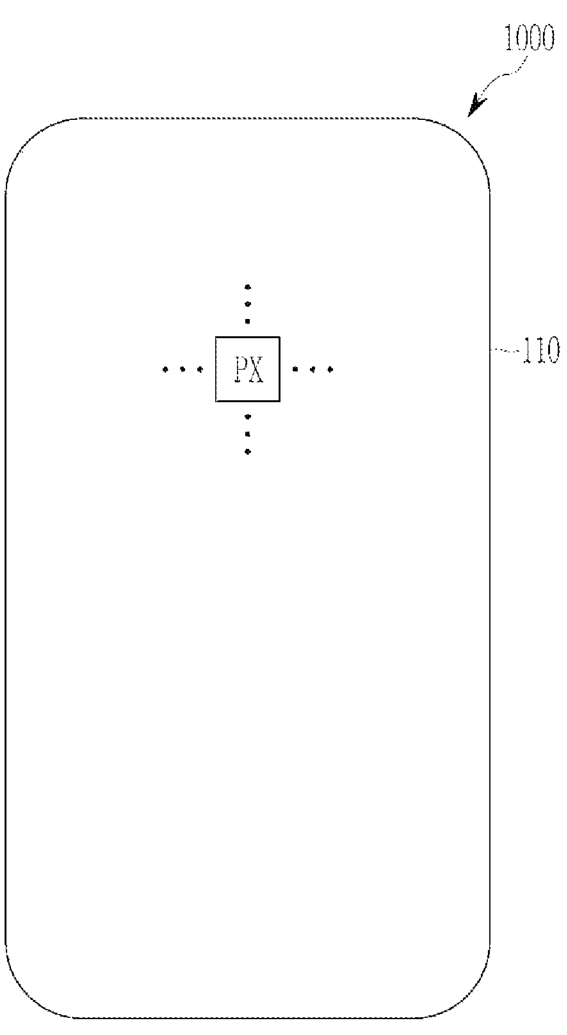
FIG. 1 illustrates a schematic top plan view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, as described herein, the phrase "in a plan view" denotes when an object portion is viewed from above, and the phrase "in a cross-sectional view" denotes when a cross-section taken by vertically cutting an object portion is viewed from the side.

Hereinafter, a display device according to an embodiment will be described with reference to FIG. 1 to FIG. 4.

Figure 2:
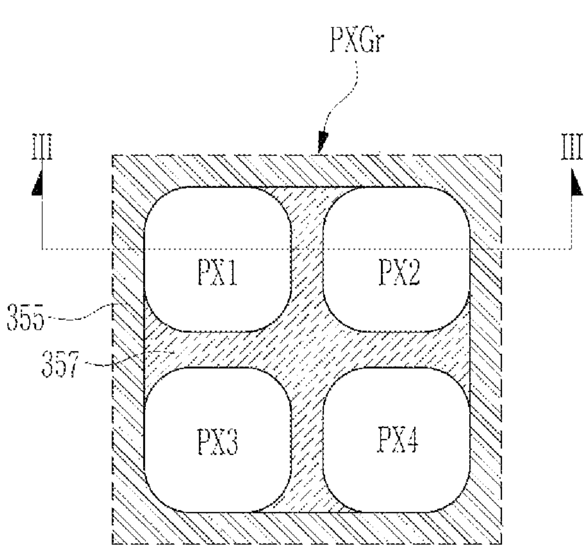
FIG. 2 illustrates one pixel group of a display device according to an embodiment.
Figure 3:
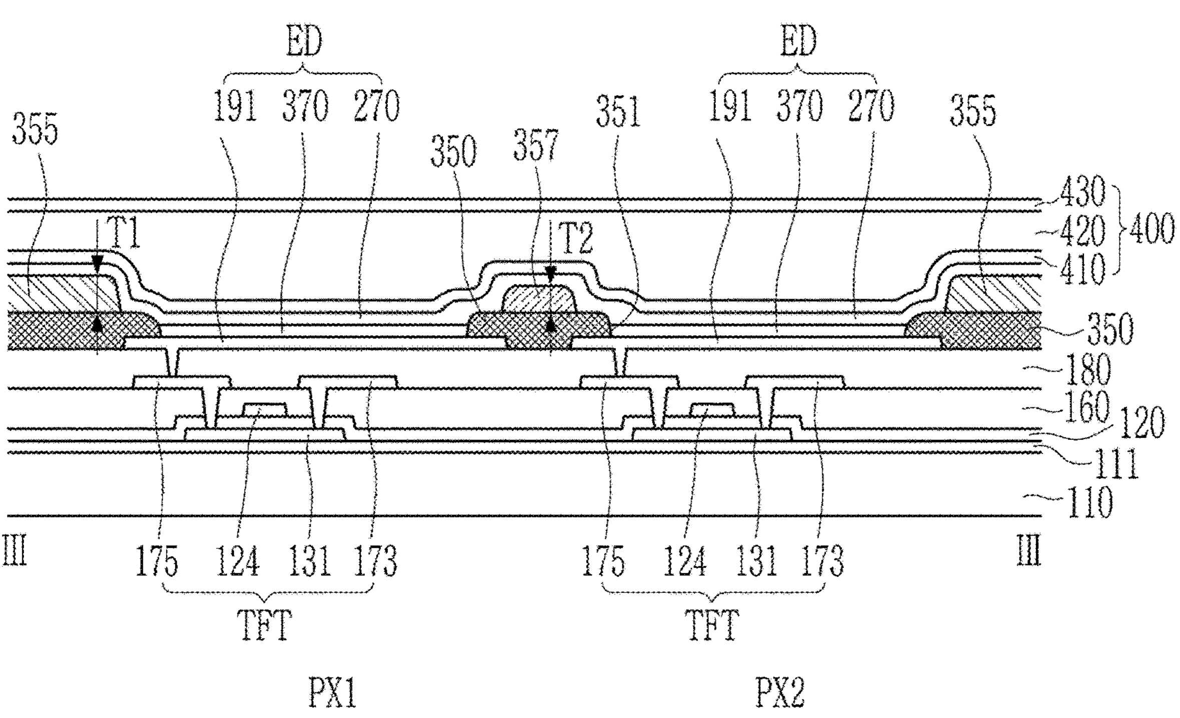
FIG. 3 illustrates a cross-sectional view of a display device taken along line III-III of FIG. 2 according to an embodiment.
Figure 4:
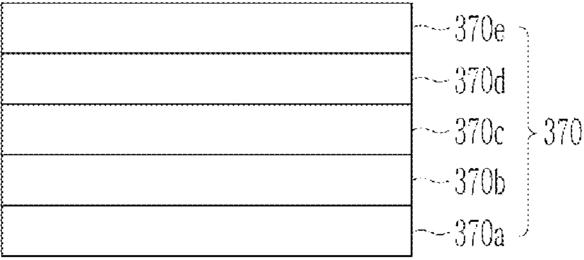
FIG. 4 illustrates a cross-sectional view showing subdivided layers of a display device according to an embodiment.

FIG. 1 illustrates a schematic top plan view of a display device according to an embodiment that is constructed according to principles of the invention, FIG. 2 illustrates one pixel group of a display device according to an embodiment, FIG. 3 illustrates a cross-sectional view of a display device taken along line III-III of FIG. 2 according to an embodiment, and FIG. 4 illustrates a cross-sectional view showing subdivided layers of a display device according to an embodiment.

As illustrated in FIG. 1, according to an embodiment, the display device 1000 includes a substrate 110 and a plurality of pixels PX positioned on the substrate 110.

The substrate 110 may be made of a rigid material or a flexible material. The substrate 110 may be changed into various shapes. The substrate 110 may be flexible, stretchable, foldable, bendable, or rollable.

In a plan view, the substrate 110 may be formed in a substantially rectangular shape including a long side and a short side, and may have a shape having a curved surface by chamfering a corner portion. However, the shape of the substrate 110 is only an example, and may be changed to various shapes. The substrate 110 may include a display area and a peripheral area, and for example, the peripheral area may have a shape surrounding the display area.

The pixels PX may be positioned in the display area of the substrate 110. The pixels PX may be arranged in a matrix form, and at least some of the pixels PX may receive image signals to display an image accordingly. In this case, an arrangement shape of the pixels PX may be variously changed. The display device according to an embodiment may further include a plurality of signal lines. The signal lines may include a plurality of scan lines, a plurality of emission control lines, a plurality of data lines, a plurality of driving voltage lines, and the like. These signal lines may transmit a scan signal, a light emission control signal, a data signal, a driving voltage, and the like. The signal lines may be positioned to cross each other in a row direction or a column direction. In addition, each pixel PX may include a plurality of transistors, capacitors, and at least one light emitting diode connected to a plurality of signal lines. That is, the display device according to the embodiment may be formed as an organic light emitting diode display.

As illustrated in FIG. 2, the pixels PX may include a first pixel PX1, a second pixel PX2, a third pixel PX3, and a fourth pixel PX4. A light emitting element emitting light of a predetermined wavelength may be positioned in each of the first pixel PX1, the second pixel PX2, the third pixel PX3, and the fourth pixel PX4. For example, a light emitting element emitting red light may be positioned in the first pixel PX1, a light emitting element emitting blue light may be positioned in the second pixel PX2 and third pixel PX3, and a light emitting element emitting green light may be positioned in the fourth pixel PX4. Four pixels PX may be gathered to constitute one pixel group PXGr. That is, the pixel group PXGr may include the first pixel PX1, the second pixel PX2, the third pixel PX3, and the fourth pixel PX4. Although it has been described that one pixel group PXGr includes four pixels PX, the embodiments described herein are not limited thereto, and a number of the pixels PX constituting one pixel group PXGr may be variously changed.

The pixel group PXGr may have an approximately square shape in a plan view, and the first pixel PX1, the second pixel PX2, the third pixel PX3, and the fourth pixel PX4 may each have a substantially square shape in a plan view. The first pixel PX1 and the second pixel PX2 may be adjacent to each other in a row direction, and the third pixel PX3 and the fourth pixel PX4 may be adjacent to each other in the row direction. The first pixel PX1 and the third pixel PX3 may be adjacent to each other in a column direction, and the second pixel PX2 and the fourth pixel PX4 may be adjacent to each other in the column direction.

Hereinafter, a cross-sectional shape of each pixel of a display device according to an embodiment will be described with reference to FIG. 3. FIG. 3 illustrates cross-sections of the first pixel PX1 and the second pixel PX2, and the third pixel PX3 and the fourth pixel PX4 may also each have a cross-sectional shape similar to that of the first pixel PX1 and the second pixel PX2.

As illustrated in FIG. 3, the display device according to an embodiment may include a substrate 110, a semiconductor 131 positioned on the substrate 110, a transistor (TFT) including a gate electrode 124, a source electrode 173, and a drain electrode 175, a gate insulating layer 120, an interlayer insulating layer 160, a passivation layer 180, a pixel electrode 191, an emission layer 370, a lower partition wall 350, an outer partition wall 355, an inner partition wall 357, a common electrode 270, and an encapsulation layer 400.

The substrate 110 may include a material having a rigid characteristic such as glass, or a flexible material such as plastic or polyimide that is bendable. A buffer layer 111 for flattening a surface of the substrate 110 and blocking impurities from penetrating into the semiconductor 131 may be further positioned on the substrate 110. The barrier layer 111 may include an inorganic material, and for example, may include an inorganic insulating material such as a silicon nitride (SiNx), a silicon oxide (SiOx), and a silicon oxynitride (SiOxNy). The buffer layer 111 may have a single layer structure or a multilayer structure of the material. A barrier layer may be further positioned on the substrate 110. In this case, the barrier layer may be positioned between the substrate 110 and the buffer layer 111. The barrier layer may include an inorganic insulating material such as a silicon nitride (SiNx), a silicon oxide (SiOx), and a silicon oxynitride (SiOxNy). The barrier layer BA may have a single layer structure or a multilayer structure of the material.

The semiconductor 131 may be positioned on the substrate 110. The semiconductor 131 may include any one of amorphous silicon, polycrystalline silicon, and an oxide semiconductor. For example, the semiconductor 131 may include low temperature polysilicon (LTPS), or may include an oxide semiconductor material including at least one of zinc (Zn), indium (In), gallium (Ga), tin (Sn), and a mixture thereof. For example, the semiconductor 131 may include an indium-gallium-zinc oxide (IGZO). The semiconductor 131 may include a channel region, a source region, and a drain region into which it is classified depending on whether or not doped with impurities. The source region and the drain region may have a conductive characteristic corresponding to a conductor.

The gate insulating layer 120 may cover the semiconductor 131 and the substrate 110. The gate insulating layer 120 may include an inorganic insulating material such as a silicon nitride (SiNx), a silicon oxide (SiOx), and a silicon oxynitride (SiOxNy). The gate insulating layer 120 may have a single layer structure or a multilayer structure of the material.

The gate electrode 124 may be positioned on the gate insulating layer 120. The gate electrode 124 may include a metal such as copper (Cu), molybdenum (Mo), aluminum (Al), silver (Ag), chromium (Cr), or tantalum (Ta), or a metal alloy thereof. The gate electrode 124 may be formed as a single layer or a multilayer. A region of the semiconductor 131 that overlaps the planar gate electrode 124 may be a channel region.

The interlayer insulating layer 160 may cover the gate electrode 124 and the gate insulating layer 120. The interlayer insulating layer 160 may include an inorganic insulating material such as a silicon nitride (SiNx), a silicon oxide (SiOx), and a silicon oxynitride (SiOxNy). The interlayer insulating layer 160 may have a single layer structure or a multilayer structure of the material.

The source electrode 173 and the drain electrode 175 are positioned on the interlayer insulating layer 160. The source electrode 173 and the drain electrode 175 may be connected to the source region and the drain region of the semiconductor 131 through openings formed in the interlayer insulating layer 160 and the gate insulating layer 120, respectively. The semiconductor 131, the gate electrode 124, the source electrode 173, and the drain electrode 175 described above constitute one thin film transistor TFT. According to an embodiment, the transistor TFT may include only the source region and the drain region of the semiconductor 131 instead of the source electrode 173 and the drain electrode 175. Although one transistor TFT is illustrated in each of the first pixel PX1 and the second pixel PX2, the present invention is not limited thereto, and a plurality of transistors TFTs may be positioned in each of the first pixel PX1 and the second pixel PX2.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like or a metal alloy thereof. The source electrode 173 and the drain electrode 175 may be formed as a single layer or a multilayer. The source electrode 173 and the drain electrode 175 according to an embodiment may be configured as a triple layer including an upper layer, an intermediate layer and a lower layer, the upper layer and the lower layer may include titanium (Ti), and the intermediate layer may include aluminum (Al).

The passivation layer 180 may be positioned on the source electrode 173 and the drain electrode 175. The passivation layer 180 covers the source electrode 173, the drain electrode 175, and the interlayer insulating layer 160. The passivation layer 180, which is for planarizing a surface of the substrate 110 provided with the transistor TFT, may be an organic insulating layer, and may include at least one material of a polyimide, a polyamide, an acrylic resin, benzocyclobutene, and a phenol resin.

The pixel electrode 191 may be positioned on the passivation layer 180. The pixel electrode 191 is also referred to as an anode, and may be formed as a single layer including a transparent conductive oxide film or a metal material or as multiple layers including them. The transparent conductive oxide layer may include an indium tin oxide (ITO), a poly-ITO, an indium zinc oxide (IZO), an indium gallium zinc oxide (IGZO), an indium tin zinc oxide (ITZO), and the like. The metal material may include silver (Ag), molybdenum (Mo), copper (Cu), gold (Au), and aluminum (Al).

The passivation layer 180 may include a via hole exposing the drain electrode 175. The drain electrode 175 and the pixel electrode 191 may be physically and electrically connected through the via hole of the passivation layer 180. Accordingly, the pixel electrode 191 can receive an output current to be transferred from the drain electrode 175 to the emission layer 370.

The lower partition wall 350 may be positioned on the pixel electrode 191 and the passivation layer 180. The lower partition wall 350 is also referred to as a pixel defining layer (PDL), and has a pixel opening 351 overlapping at least a portion of the pixel electrode 191. In this case, the pixel opening 351 may overlap a central portion of the pixel electrode 191, and may not overlap an edge portion of the pixel electrode 191. As a result, a size of the pixel opening 351 may be smaller than that of the pixel electrode 191. The lower partition wall 350 may define a formation position of the emission layer 370 such that the emission layer 370 may be positioned on a portion thereof where an upper surface of the pixel electrode 191 is exposed. The lower partition wall 350 may be formed as an organic insulator including at least one material of a polyimide, a polyamide, an acryl resin, benzocyclobutene, and a phenol resin. According to an embodiment, the lower partition wall 350 may also be formed as a black pixel defining layer (BPDL) including a black pigment.

The lower partition wall 350 may be positioned at a boundary between the pixels PX. The lower partition wall 350 may be positioned at a boundary between the first pixel PX1 and the second pixel PX2, a boundary between the first pixel PX1 and the third pixel PX3, a boundary between the second pixel PX2 and the fourth pixel PX4, and a boundary between the third pixel PX3 and the fourth pixel PX4. in addition, the lower partition wall 350 may be positioned to surround the first pixel PX1, the second pixel PX2, the third pixel PX3, and the fourth pixel PX4. That is, the lower partition wall 350 may be positioned to surround the pixel group PXGr.

Each of the pixel openings 351 may have a shape similar to that of the pixel electrode 191 in a plan view. For example, the pixel opening 351 and the pixel electrode 191 may have a polygonal shape in a plan view. In this case, corner portions of the pixel opening 351 and the pixel electrode 191 may be chamfered. However, a shape of the pixel opening 351 and a shape of the pixel electrode 191 are not limited thereto, and may be variously changed.

In this case, the pixel electrodes 191 corresponding to each of the first pixel PX1, the second pixel PX2, the third pixel PX3, and the fourth pixel PX4 may have a same size in a plan view. Similarly, the pixel openings 351 corresponding to each of the first pixel PX1, the second pixel PX2, the third pixel PX3, and the fourth pixel PX4 may have a same size in a plan view. However, the embodiments described herein are not limited thereto, and each of the pixel openings 351 and the pixel electrodes 191 may be set to have different sizes.

The outer partition wall 355 and the inner partition wall 357 may be positioned on the lower partition wall 350. The outer partition wall 355 may be positioned on at least a portion of the lower partition wall 350, and the inner partition wall 357 may be positioned on another portion of the lower partition wall 350. That is, the outer partition wall 355 may overlap a partial area of the lower partition wall 350, and the inner partition wall 357 may overlap another partial area of the lower partition wall 350. The outer partition wall 355 and the inner partition wall 357 do not overlap each other.

The inner partition wall 357 is surrounded by the outer partition wall 355. The inner partition wall 357 may have a cross shape crossing a center of the pixel group PXGr in a plan view. The inner partition wall 357 may be positioned at a boundary between the first pixel PX1 and the second pixel PX2, a boundary between the first pixel PX1 and the third pixel PX3, a boundary between the second pixel PX2 and the fourth pixel PX4, and a boundary between the third pixel PX3 and the fourth pixel PX4. That is, the inner partition wall 357 may be positioned between the pixels PX1, PX2, PX3, and PX4 positioned within the pixel group PXGr. The outer partition wall 355 may have a rectangular shape surrounding the pixel group PXGr in a plan view. That is, the first pixel PX1, the second pixel PX2, the third pixel PX3, and the fourth pixel PX4 may be surrounded by the outer partition wall 355.

A thickness T1 of the outer partition wall 355 may be different from a thickness T2 of the inner partition wall 357. The thickness T1 of the outer partition wall 355 may be thicker than the thickness T2 of the inner partition wall 357. A length from an upper surface of the substrate 110 to an upper surface of the outer partition wall 355 may be longer than a length from the upper surface of the substrate 110 to an upper surface of the inner partition wall 357.

The outer partition wall 355 and the inner partition wall 357 may each be formed of a liquid-repellent material. The outer partition wall 355 and the inner partition wall 357 may each include a functionalized polymer containing a fluorine (F) group or a silicon nitride (SiNx). The outer partition wall 355 may include a different material from that of the inner partition wall 357. The outer partition wall 355 and the inner partition wall 357 may be formed by using different processes. Surface energy of the outer partition wall 355 may be lower than that of the inner partition wall 357. That is, the outer partition wall 355 may include a material having relatively low surface energy, and the inner partition wall 357 may include a material having relatively high surface energy. A contact angle of the outer partition wall 355 may be higher than that of the inner partition wall 357. That is, the outer partition wall 355 may include a material having a relatively high contact angle, and the inner partition wall 357 may include a material having a relatively low contact angle. The contact angle of the outer partition wall 355 may be about 50 degrees or more, and the contact angle of the inner partition wall 357 may be about 40 degrees or more and less than about 50 degrees. Accordingly, liquid repellency of the outer partition wall 355 may be relatively higher than that of the inner partition wall 357.

The emission layer 370 may be disposed within the pixel opening 351 defined by the lower partition wall 350. The emission layer 370 may include an individual emission layer 370*c* and common layers 370*a*, 370*b*, 370*d*, and 370*e* positioned below or above the individual emission layer 370*c*.

The individual emission layer 370*c* may include a low-molecular or high-molecular organic material emitting red, green, or blue light. For example, the individual emission layer 370*c* including an organic material emitting red light may be positioned in the first pixel PX1. The individual emission layer 370*c* including an organic material emitting blue light may be positioned in the second pixel PX2 and the third pixel PX3. For example, the individual emission layer 370*c* including an organic material emitting green light may be positioned in the fourth pixel PX4. Individual emission layers 370*c* including different materials may be positioned in the respective pixels PX.

The common layers 370*a*, 370*b*, 370*d*, and 370*e* may include an electron injection layer 370*a*, an electron transport layer 370*b*, a hole transport layer 370*d*, a hole injection layer 370*e*, etc. The electron transport layer 370*b* may be positioned at a lower side of the individual emission layer 370*c*, and the electron injection layer 370*a* may be positioned at a lower side of the electron transport layer 370*b*. The hole transport layer 370*d* may be positioned at an upper side of the individual emission layer 370*c*, and the hole injection layer 370*e* may be positioned at an upper side of the hole transport layer 370*d*. The common layers 370*a*, 370*b*, 370*d*, and 370*e* including a same material may be positioned in the first pixel PX1, the second pixel PX2, the third pixel PX3, and the fourth pixel PX4. That is, the same common layers 370*a*, 370*b*, 370*d*, and 370*e* may be positioned in each pixel PX. At least some of the electron injection layer 370*a*, the electron transport layer 370*b*, the hole transport layer 370*d*, and the hole injection layer 370*e* in the common layers 370*a*, 370*b*, 370*d*, and 370*e* may be omitted. The electron injection layer 370*a* may be in contact with the pixel electrode 191. The hole injection layer 370*e* may be in contact with the common electrode 270.

Another emission layer may be further positioned on the emission layer 370. That is, two or more emission layers 370 may be stacked.

A spacer may be further positioned on the outer partition wall 355 or the inner partition wall 357. The spacer may include a same material as at least one of the outer partition wall 355, the inner partition wall 357, or the lower partition wall 350. However, the embodiments described herein are not limited thereto, and the spacer may be made of a different material from those of the outer partition wall 355, the inner partition wall 357, and the lower partition wall 350. The spacer may be formed as an organic insulator including at least one material of a polyimide, a polyamide, an acryl resin, benzocyclobutene, and a phenol resin.

The common electrode 270 may be positioned on the outer partition wall 355, the inner partition wall 357, the lower partition wall 350, and the emission layer 370. The common electrodes 270 of the pixels PX may be connected to each other. The common electrode 270 may be positioned on the substrate 110 to be entirely connected thereto. The common electrode 270 may be referred to as a cathode, and may be formed of a transparent conductive layer including an indium tin oxide (ITO), an indium zinc oxide (IZO), an indium gallium zinc oxide (IGZO), an indium tin zinc oxide (ITZO), etc. The common electrode 270 may be made of a metal material such as silver (Ag), magnesium (Mg), or the like, or a mixture thereof. In this case, the thickness of the common electrode 270 may be adjusted to form a transparent conductive layer. In addition, the common electrode 270 may have a translucent characteristic, and in this case, it may constitute a micro-cavity together with the pixel electrode 191.

The pixel electrode 191, the emission layer 370, and the common electrode 270 may constitute a light emitting diode ED. A portion where the pixel electrode 191, the emission layer 370, and the common electrode 270 overlap in each pixel PX may be an emission area of each light emitting element ED.

The encapsulation layer 400 may be disposed on the common electrode 270. The encapsulation layer 400 may include at least one inorganic layer and at least one organic layer. In the embodiment described herein, the encapsulation layer 400 may include a first inorganic encapsulation layer 410, an organic encapsulation layer 420, and a second inorganic encapsulation layer 430. However, this is merely an example, and numbers of inorganic and organic layers constituting the encapsulation layer 400 may be variously changed. The first inorganic encapsulation layer 410, the organic encapsulation layer 420, and the second inorganic encapsulation layer 430 may be disposed in a portion of the display area and the peripheral area. According to an embodiment, the organic encapsulation layer 420 may be formed around the display area, and the first inorganic encapsulation layer 410 and the second inorganic encapsulation layer 430 may be formed up to the peripheral area. The encapsulation layer 400, which is for protecting the light emitting diode ED from moisture or oxygen that may be introduced from the outside, may be formed to directly contact first ends of the first inorganic encapsulation layer 410 and the second inorganic encapsulation layer 430.

Next, a manufacturing method of a display device according to an embodiment will be described below with further reference to FIG. 5 to FIG. 12.

Figure 5:
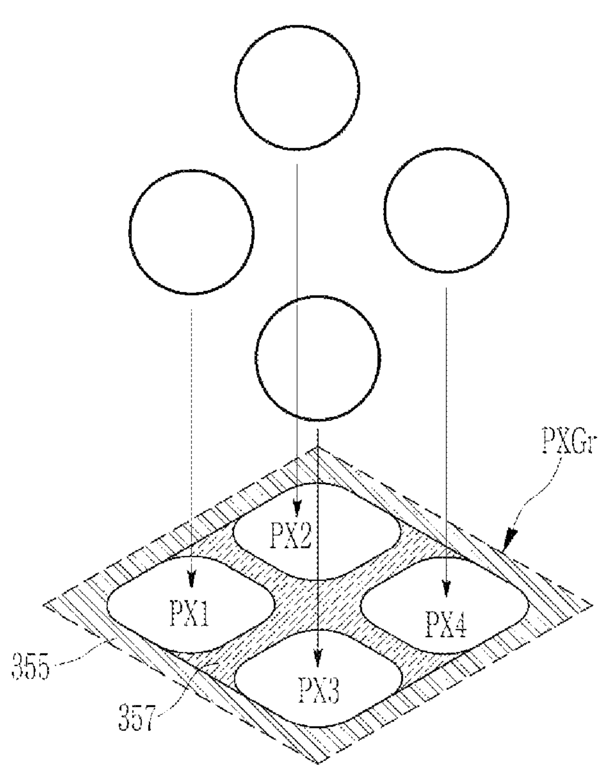
FIG. 5 to FIG. 7 illustrate perspective or cross-sectional views sequentially illustrating a process of forming some layers of a display device according to an embodiment.
Figure 6:
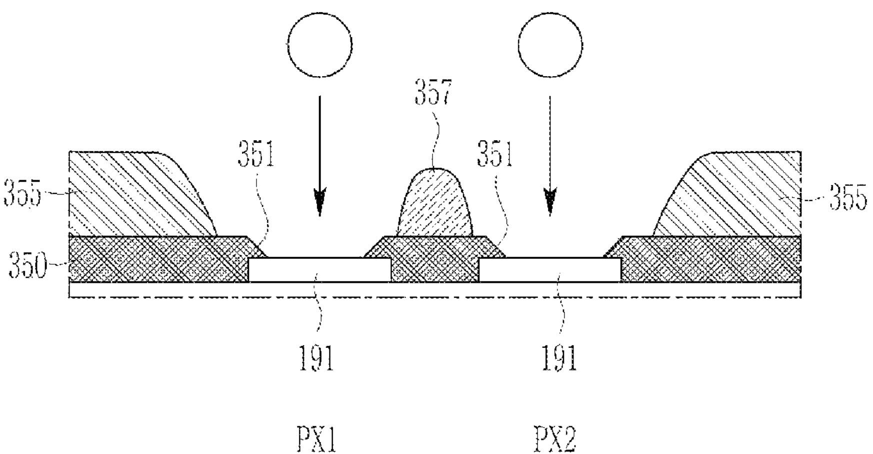
Figure 7:
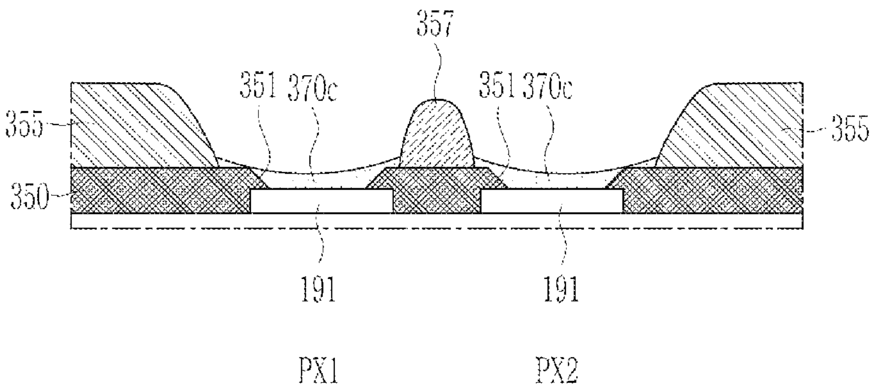

FIG. 5 to FIG. 7 illustrate perspective or cross-sectional views sequentially illustrating a process of forming some layers of a display device according to an embodiment. FIG. 8 to FIG. 12 illustrate perspective or cross-sectional views sequentially illustrating a process of forming some layers of a display device according to an embodiment. FIG. 5 to FIG. 7 illustrate a process of forming an individual emission layer of an emission layer of a display device according to an embodiment, and FIG. 8 to FIG. 12 illustrate a process of forming a common layer of an emission layer of a display device according to an embodiment. In FIG. 5 to FIG. 12, some layers of a display device according to an embodiment are omitted for ease in explanation of these figures. For example, in FIG. 5 to FIG. 12, illustration of the substrate, the buffer layer, the transistor, the gate insulating layer, the first interlayer insulating layer, and the like are omitted for sake of brevity.

First, as illustrated in FIG. 3, the transistor TFT including the semiconductor 131, the gate electrode 124, the source electrode 173, and the drain electrode 175 is positioned on the substrate 110. The passivation layer 180 is disposed on the transistor TFT, and the pixel electrode 191 is disposed on the passivation layer 180.

Next, the lower partition wall 350 is positioned on the pixel electrode 191. The pixel openings 351 overlapping the pixel electrodes 191 are positioned on the lower partition wall 350. The pixel opening 351 may overlap a central portion of the pixel electrode 191, and may not overlap an edge portion of the pixel electrode 191.

Next, the outer partition wall 355 is positioned on at least a portion of the lower partition wall 350. The outer partition wall 355 may be formed to surround the pixel group PXGr.

Next, the inner partition wall 357 is positioned on at least a portion of the lower partition wall 350. The inner partition wall 357 may be formed between the pixels PX1, PX2, PX3, and PX4 positioned in the pixel group PXGr.

The outer partition wall 355 and the inner partition wall 357 may be formed of different materials. The outer partition wall 355 and the inner partition wall 357 may formed in different processes using different masks. The outer partition wall 355 may be formed first, and then the inner partition wall 357 may be formed. Conversely, after the inner partition wall 357 is first formed, the outer partition wall 355 may be formed.

The outer partition wall 355 and the inner partition wall 357 may each be formed of a liquid-repellent material. Surface energy of the outer partition wall 355 may be lower than that of the inner partition wall 357. A contact angle of the outer partition wall 355 may be higher than that of the inner partition wall 357. Accordingly, liquid repellency of the outer partition wall 355 may be relatively higher than that of the inner partition wall 357. The inner partition wall 357 is surrounded by the outer partition wall 355. The thickness T1 of the outer partition wall 355 may be thicker than the thickness T2 of the inner partition wall 357.

Next, the emission layer 370 may be formed in the pixel opening 351. The emission layer 370 is positioned over the pixel electrode 191 exposed by the pixel opening 351. The emission layer 370 may include a plurality of layers. The emission layer 370 may include an individual emission layer 370*c* and common layers 370*a*, 370*b*, 370*d*, and 370*e* positioned below or above the individual emission layer 370*c*. The electron injection layer 370*a* and the electron transport layer 370*b* are sequentially formed, and the individual emission layer 370*c* is formed, and then the hole transport layer 370*d* and the hole injection layer 370*e* may be sequentially formed.

First, a process of forming an individual emission layer will be described with reference to FIG. 5 to FIG. 7.

As illustrated in FIG. 5 and FIG. 6, nozzles of the inkjet printing apparatus correspond to the pixel openings of the first pixel PX1, the second pixel PX2, the third pixel PX3, and the fourth pixel PX4 constituting the pixel group PXGr. Ink is dripped so as to correspond to each of the pixel openings 351 by discharging the ink from the nozzle. That is, the ink is dripped separately for each pixel PX.

When the ink dripped into each pixel opening 351 is dried, the individual emission layer 370*c* may be disposed on the pixel electrode 191 as illustrated in FIG. 7. The electron injection layer 370*a*, the electron transport layer 370*b*, etc. may be further formed prior to the formation of the individual emission layer 370*c*.

The individual emission layer 370*c* positioned in the first pixel PX1 and the individual emission layer 370*c* positioned in the second pixel PX2 may be made of different materials. The individual emission layer 370*c* positioned in the first pixel PX1 may include an organic material emitting red light, and the individual emission layer 370*c* positioned in the second pixel PX2 may include an organic material emitting blue light. The individual emission layer 370*c* positioned in the third pixel PX3 may include an organic material emitting blue light, and the individual emission layer 370*c* positioned in the fourth pixel PX4 may include an organic material emitting green light.

Next, a process of forming a common layer will be described with reference to FIG. 8 to FIG. 12.

Figure 8:
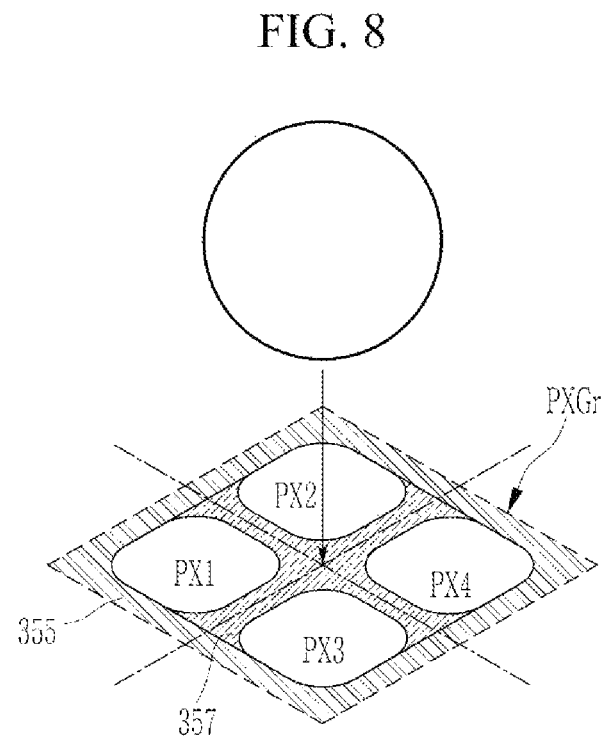
Figure 9:
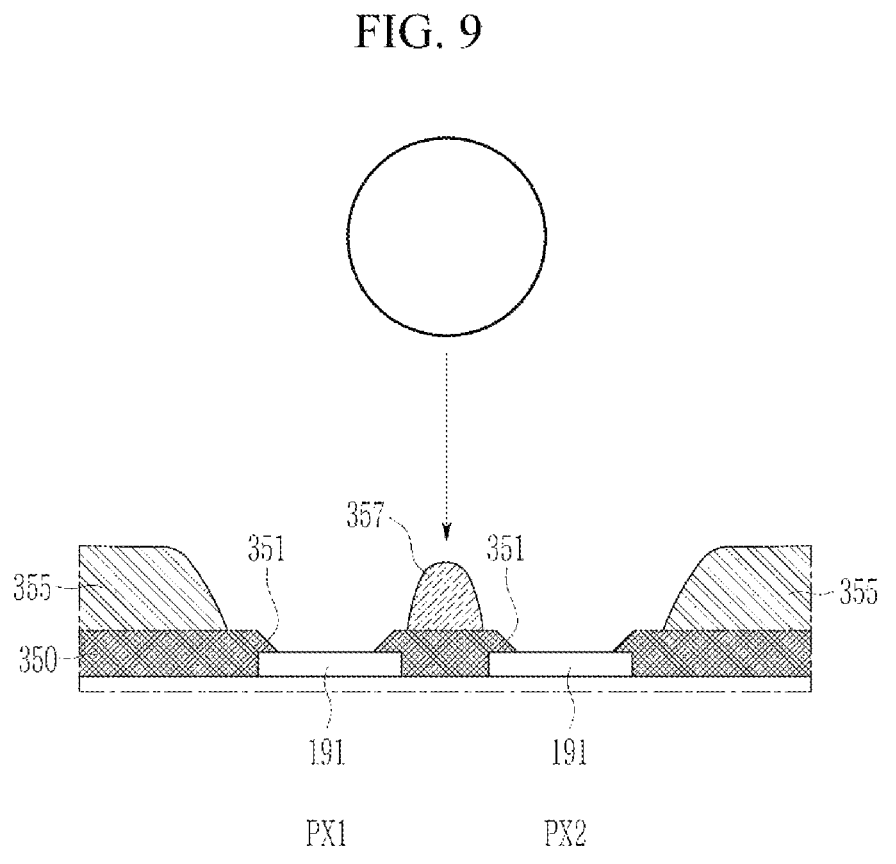

As illustrated in FIG. 8 and FIG. 9, nozzles of the inkjet printing apparatus correspond to the inner partition wall 357 positioned at boundaries between the first pixel PX1, the second pixel PX2, the third pixel PX3, and the fourth pixel PX4 constituting the pixel group PXGr. Ink is dripped so as to correspond to the inner partition wall 357 by discharging the ink from the nozzle. That is, common ink is dripped into the pixel group PXGr. For example, the ink for forming the electron injection layer 370*a* may be dripped to centers of the boundaries between the first pixel PX1, the second pixel PX2, the third pixel PX3, and the fourth pixel PX4.

An amount of ink discharged from one nozzle in a process of forming the common layers 370*a*, 370*b*, 370*d*, and 370*e* may be greater than that of ink discharged from one nozzle in a process of forming the individual emission layer 370*c*. A number of times of discharging ink in the process of forming the common layers 370*a*, 370*b*, 370*d*, and 370*e* may be smaller than that of discharging ink in the process of forming the individual emission layer 370*c*. Accordingly, resolution of an inkjet printing apparatus used in the process of forming the common layers 370*a*, 370*b*, 370*d*, and 370*e* may be lower than that of an inkjet printing apparatus used in the process of forming the individual emission layer 370*c*. Therefore, in accordance with a manufacturing method of a display device according to an embodiment, difficulty of the process of forming the common layers 370*a*, 370*b*, 370*d*, and 370*e* may be reduced, a process time thereof may be shortened, and a cost thereof may be reduced.

Figure 10:
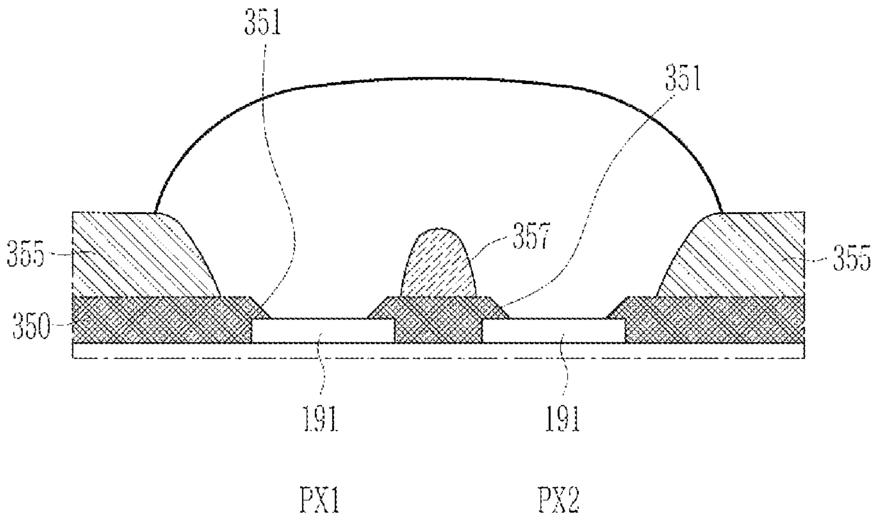

As illustrated in FIG. 10, the ink that has fallen onto the inner partition wall 357 fills the pixel opening 351. Since the outer partition wall 355 is made of a liquid-repellent material, ink may be confined in the pixel opening 351 without being positioned on an upper surface of the outer partition wall 355. The outer partition wall 355 has relatively low surface energy, a higher contact angle, and a thicker thickness compared with the inner partition wall 357. Accordingly, the ink is positioned within the pixel group PXGr surrounded by the outer partition wall 355, and may not deviate to the outside of the pixel group PXGr. The ink may be positioned on the inner partition wall 357.

Figure 11:
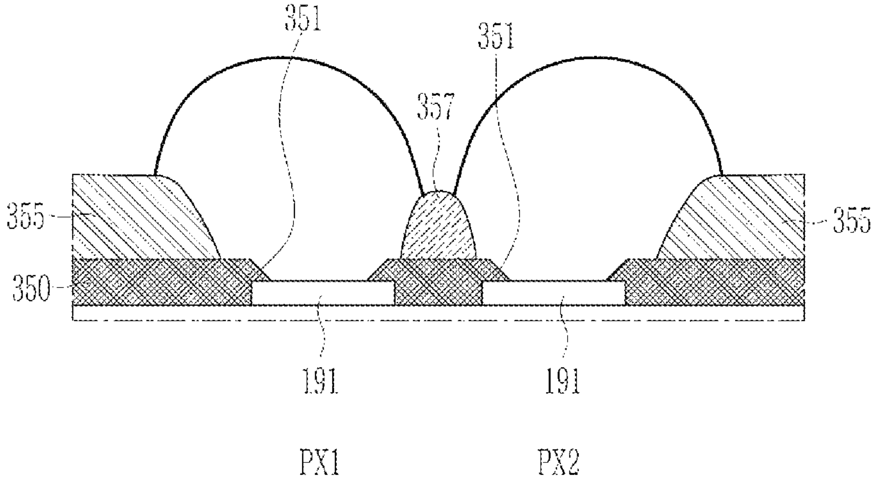

As illustrated in FIG. 11, the ink positioned on the inner partition wall 357 may be separated into opposite sides. Since the inner partition wall 357 is made of a liquid-repellent material, the ink that has fallen to the upper surface of the inner partition wall 357 moves from the upper surface of the inner partition wall 357 to another position over time. Accordingly, the ink may be separated into the pixel openings 351. That is, one bulky droplet is dripped into one pixel group PXGr, confined by the outer partition wall 355, and separated by the inner partition wall 357 to be positioned in the respective pixel openings 351.

Figure 12:
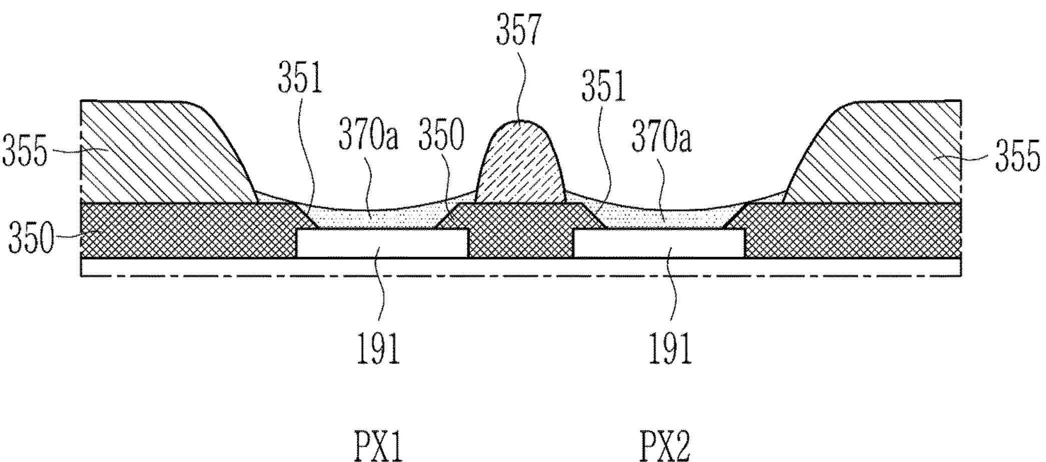

When the ink separated into each pixel opening 351 is dried, the electron injection layer 370*a* may be disposed on the pixel electrode 191 as illustrated in FIG. 12. After the electron injection layer 370*a* is formed, the electron transport layer 370*b* may be formed in a same manner. Next, after forming the individual emission layer 370*c* by the process method shown in FIG. 5 to FIG. 7, the hole transport layer 370*d* and the hole injection layer 370*e* may be sequentially formed by the process method illustrated in FIG. 8 to FIG. 12.

The common layers 370*a*, 370*b*, 370*d*, and 370*e* positioned in the first pixel PX1 and the common layers 370*a*, 370*b*, 370*d*, and 370*e* positioned in the second pixel PX2 may be made of a same material. Similarly, the common layers 370*a*, 370*b*, 370*d*, and 370*e* positioned in the first pixel PX1, the second pixel PX2, the third pixel PX3, and the fourth pixel PX4 that are positioned in the pixel group PXGr may be made of a same material.

Next, a display device and a manufacturing method thereof according to an embodiment will be described with reference to FIG. 13 to FIG. 20.

Since the display device and the manufacturing method thereof according to the embodiment illustrated in FIG. 13 to FIG. 20 is substantially the same as the display device and the manufacturing method thereof according to the embodiment shown in FIG. 1 to FIG. 12, a description of the same parts will be omitted. The embodiment described with reference to FIG. 1 to FIG. 12 is different from the previously-described embodiment in that sizes of the pixels constituting one pixel group are different from those of the previous embodiment in a plan view, which will be further described below.

Figure 13:
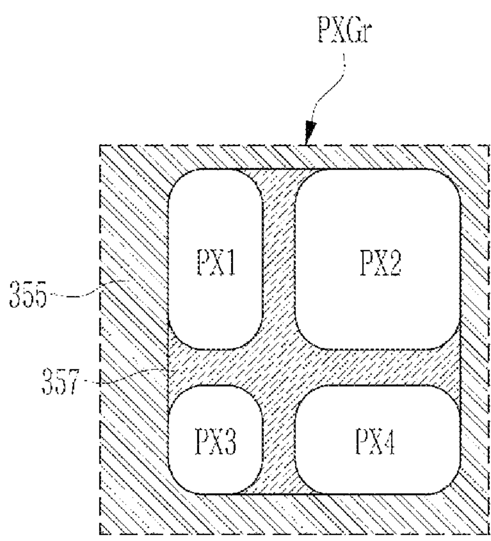
FIG. 13 illustrates one pixel group of a display device according to an embodiment.
Figure 14:
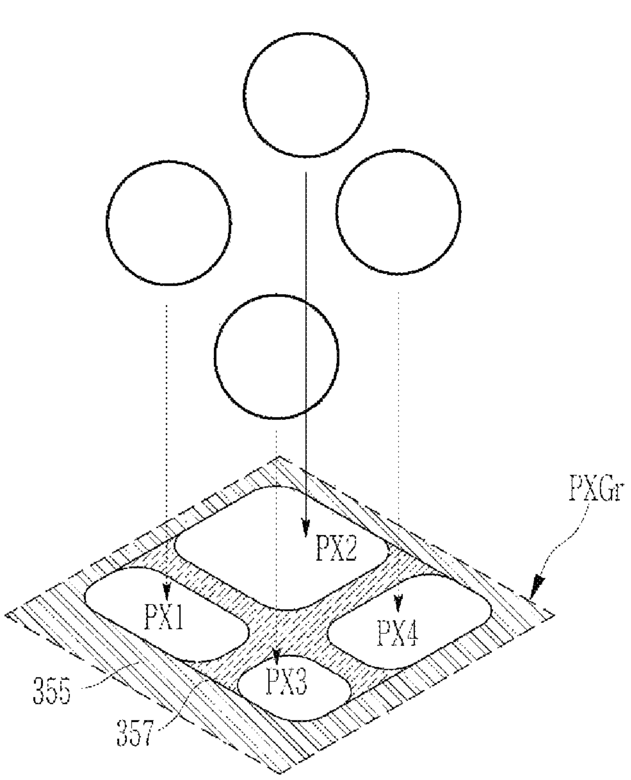
FIG. 14 to FIG. 16 illustrate perspective or cross-sectional views sequentially illustrating a process of forming some layers of a display device according to an embodiment.
Figure 15:
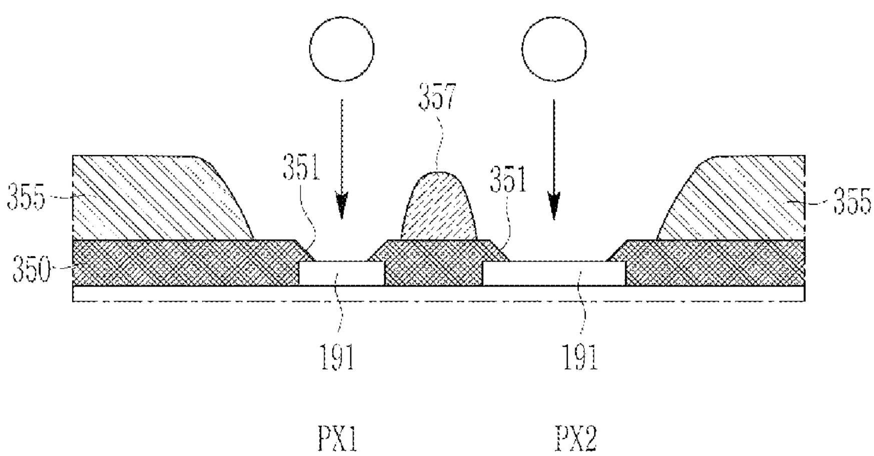
Figure 16:
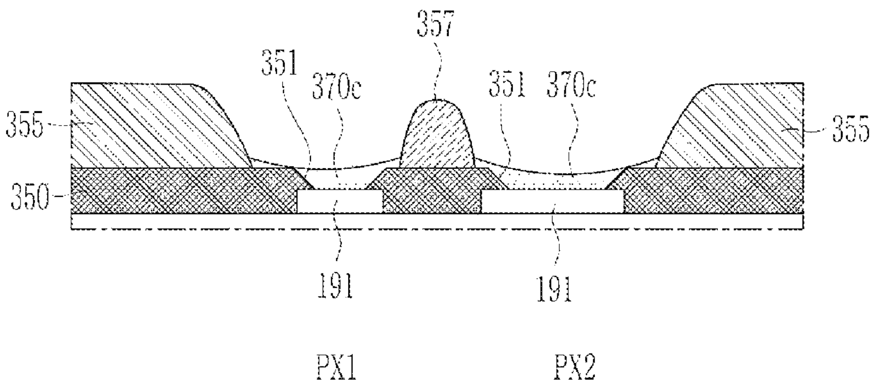

FIG. 13 illustrates one pixel group of a display device according to an embodiment. FIG. 14 to FIG. 16 illustrate perspective or cross-sectional views sequentially illustrating a process of forming some layers of a display device according to an embodiment. FIG. 17 to FIG. 20 illustrate perspective or cross-sectional views showing various examples of a first interlayer insulating layer of a display device according to an embodiment. FIG. 14 to FIG. 16 illustrate a process of forming an individual emission layer of an emission layer of a display device according to an embodiment, and FIG. 17 to FIG. 20 illustrate a process of forming a common layer of an emission layer of a display device according to an embodiment.

As illustrated in FIG. 13, one pixel group PXGr may include a first pixel PX1, a second pixel PX2, a third pixel PX3, and a fourth pixel PX4. A light emitting element emitting light of a predetermined wavelength may be positioned in each of the first pixel PX1, the second pixel PX2, the third pixel PX3, and the fourth pixel PX4. For example, a light emitting element emitting red light may be positioned in the first pixel PX1, a light emitting element emitting blue light may be positioned in the second pixel PX2 and the third pixel PX3, and a light emitting element emitting green light may be positioned in the fourth pixel PX4. Four pixels PX may be gathered to constitute one pixel group PXGr. That is, the pixel group PXGr may include the first pixel PX1, the second pixel PX2, the third pixel PX3, and the fourth pixel PX4. Although it has been described that one pixel group PXGr includes four pixels PX, the present invention is not limited thereto, and a number of the pixels PX constituting one pixel group PXGr may be variously changed.

The pixel group PXGr may have a substantially square shape in a plan view. In the previously-described embodiment, the first pixel PX1, the second pixel PX2, the third pixel PX3, and the fourth pixel PX4 may be positioned in a center of the pixel group PXGr, while in the embodiment, the first pixel PX1, the second pixel PX2, the third pixel PX3, and the fourth pixel PX4 may be positioned to be biased toward an upper right side of the pixel group PXGr. The second pixel PX2 and the third pixel PX3 may each have an approximately square shape in a plan view, and the first pixel PX1 and the fourth pixel PX4 may each have an approximately rectangular shape in a plan view. A size of the second pixel PX2 may be greater than a size of the third pixel PX3 in a plan view. Each of the first pixel PX1 and the fourth pixel PX4 may have a rectangular shape including two sides having a same length as one side of the second pixel PX2 and two sides having a same length as one side of the third pixel PX3. However, the shapes of the first pixel PX1, the second pixel PX2, the third pixel PX3, and the fourth pixel PX4 are only examples in a plan view, and may be variously changed. The first pixel PX1 and the second pixel PX2 may be adjacent to each other in a row direction, and the third pixel PX3 and the fourth pixel PX4 may be adjacent to each other in the row direction. The first pixel PX1 and the third pixel PX3 may be adjacent to each other in a column direction, and the second pixel PX2 and the fourth pixel PX4 may be adjacent to each other in the column direction.

Next, a manufacturing method of a display device according to an embodiment will be described below with further reference to FIG. 13 to FIG. 20.

As in the previously-described embodiment, the transistor, the passivation layer, and the pixel electrode 191 are formed on the substrate. Next, the lower partition wall 350, the outer partition wall 355, and the inner partition wall 357 are formed. The outer partition wall 355 and the inner partition wall 357 may be formed of different materials. The outer partition wall 355 and the inner partition wall 357 may formed in different processes using different masks. The outer partition wall 355 and the inner partition wall 357 may each be formed of a liquid-repellent material. Surface energy of the outer partition wall 355 may be lower than that of the inner partition wall 357. A contact angle of the outer partition wall 355 may be higher than that of the inner partition wall 357.

Next, an emission layer may be formed within the pixel opening 351. The emission layer 370 may include an individual emission layer 370*c* and common layers 370*a*, 370*b*, 370*d*, and 370*e* positioned below or above the individual emission layer 370*c*.

First, a process of forming an individual emission layer will be described with reference to FIG. 14 to FIG. 16.

As illustrated in FIG. 14 and FIG. 15, nozzles of the inkjet printing apparatus correspond to the pixel openings of the first pixel PX1, the second pixel PX2, the third pixel PX3, and the fourth pixel PX4 constituting the pixel group PXGr. Ink is dripped so as to correspond to each of the pixel openings 351 by discharging the ink from the nozzle. That is, the ink is dripped separately for each pixel PX.

When the ink dripped into each pixel opening 351 is dried, the individual emission layer 370*c* may be disposed on the pixel electrode 191 as illustrated in FIG. 16. The electron injection layer 370*a*, the electron transport layer 370*b*, etc. may be further formed prior to the formation of the individual emission layer 370*c*.

The individual emission layer 370*c* positioned in the first pixel PX1 and the individual emission layer 370*c* positioned in the second pixel PX2 may be made of different materials. The individual emission layer 370*c* positioned in the first pixel PX1 may include an organic material emitting red light, and the individual emission layer 370*c* positioned in the second pixel PX2 may include an organic material emitting blue light. The individual emission layer 370*c* positioned in the third pixel PX3 may include an organic material emitting blue light, and the individual emission layer 370*c* positioned in the fourth pixel PX4 may include an organic material emitting green light.

A thickness of the individual emission layer 370*c* positioned on the first pixel PX1 may be different from that of the individual emission layer 370*c* positioned on the second pixel PX2. The thickness of the individual emission layer 370*c* positioned on the first pixel PX1 may be thicker than that of the individual emission layer 370*c* positioned on the second pixel PX2. Similarly, a thickness of the individual emission layer 370*c* positioned on the third pixel PX3 may be different from that of the individual emission layer 370*c* positioned on the fourth pixel PX4. The thickness of the individual emission layer 370*c* positioned on the second pixel PX2 may be substantially the same as that of the individual emission layer 370*c* positioned on the third pixel PX3. The thickness of the individual emission layers 370*c* of the pixels PX positioned in the pixel group PXGr may be adjusted by controlling a discharge amount of the nozzle corresponding to each pixel PX. However, the embodiments described herein are not limited thereto, and the thicknesses of the individual emission layers 370*c* of the pixels PX positioned in the pixel group PXGr may be adjusted to be the same.

Next, a process of forming a common layer will be described with reference to FIG. 17 to FIG. 20.

Figure 17:
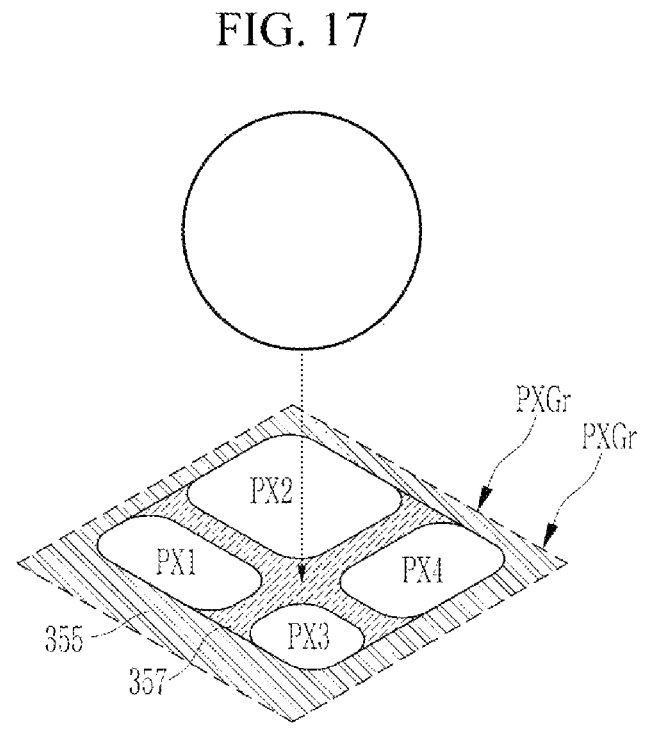
Figure 18:
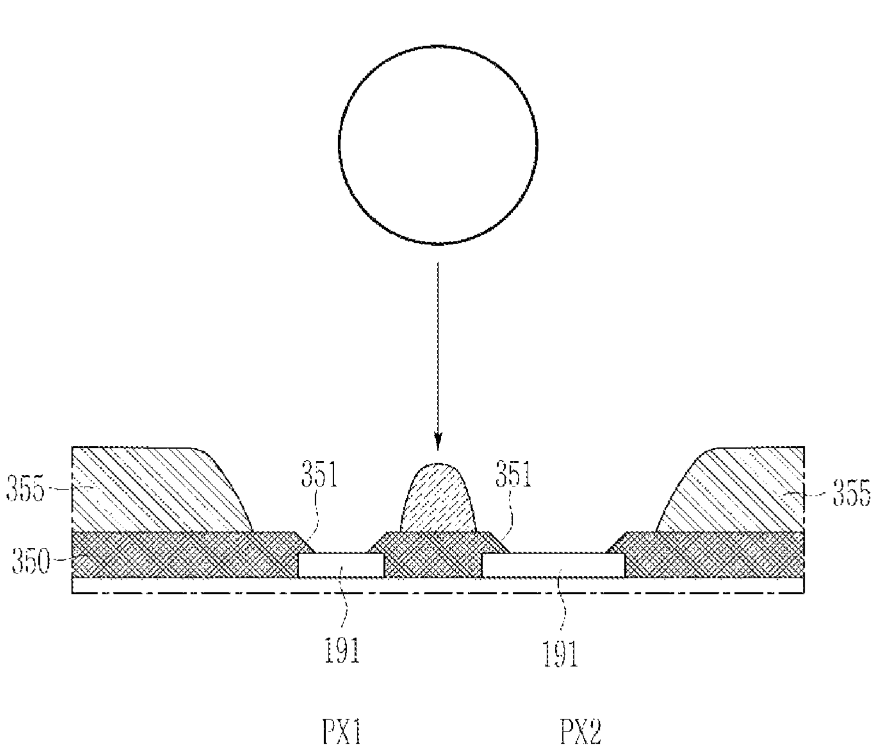

As illustrated in FIG. 17 and FIG. 18, nozzles of the inkjet printing apparatus correspond to the inner partition wall 357 positioned at boundaries between the first pixel PX1, the second pixel PX2, the third pixel PX3, and the fourth pixel PX4 constituting the pixel group PXGr. Ink is dripped so as to correspond to the inner partition wall 357 by discharging the ink from the nozzle. That is, common ink is dripped into the pixel group PXGr. For example, the ink for forming the electron injection layer 370*a* may be dripped to centers of the boundaries between the first pixel PX1, the second pixel PX2, the third pixel PX3, and the fourth pixel PX4.

An amount of ink discharged from one nozzle in a process of forming the common layers 370*a*, 370*b*, 370*d*, and 370*e* may be greater than that of ink discharged from one nozzle in a process of forming the individual emission layer 370*c*. A number of times of discharging ink in the process of forming the common layers 370*a*, 370*b*, 370*d*, and 370*e* may be smaller than that of discharging ink in the process of forming the individual emission layer 370*c*. Accordingly, resolution of an inkjet printing apparatus used in the process of forming the common layers 370*a*, 370*b*, 370*d*, and 370*e* may be lower than that of an inkjet printing apparatus used in the process of forming the individual emission layer 370*c*. Accordingly, in accordance with a manufacturing method of a display device according to an embodiment, difficulty of the process of forming the common layers 370*a*, 370*b*, 370*d*, and 370*e* may be reduced, a process time thereof may be shortened, and a cost thereof may be reduced.

Figure 19:
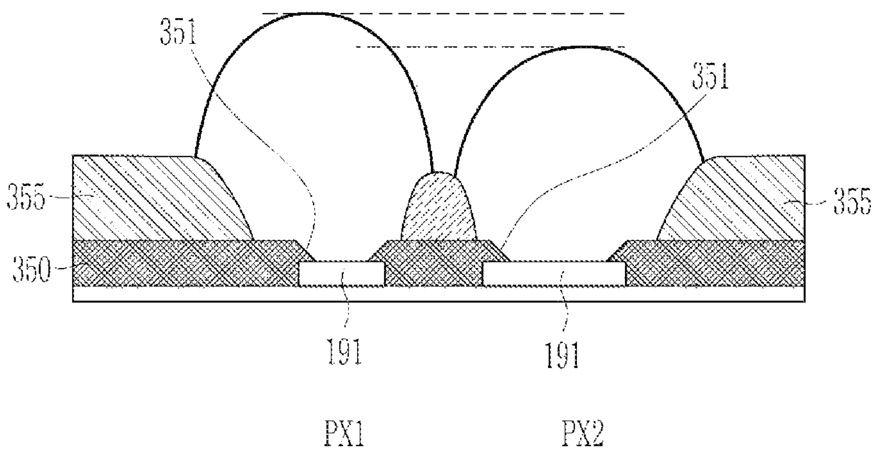

As illustrated in FIG. 19, the ink that has fallen onto the inner partition wall 357 fills the pixel opening 351. Since the outer partition wall 355 is made of a liquid-repellent material, ink may be confined in the pixel opening 351 without being positioned on an upper surface of the outer partition wall 355. Since the inner partition wall 357 is made of a liquid-repellent material, the ink that has fallen to the upper surface of the inner partition wall 357 may be separated over time. That is, one bulky droplet is dripped into one pixel group PXGr, confined by the outer partition wall 355, and separated by the inner partition wall 357 to be positioned in the respective pixel openings 351.

In this case, since sizes of the pixel openings 351 positioned at opposite sides of an ink dripped point are different, heights of the ink separated by the pixel openings 351 adjacent to each other may be different. For example, the height of the ink positioned in the pixel opening 351 of the first pixel PX1 may be higher than that positioned in the pixel opening 351 of the second pixel PX2. The height of the ink positioned in the pixel opening 351 of each pixel PX may be adjusted by controlling positions of the pixels PX constituting the pixel group PXGr, the size of the pixel opening 351 of each of the pixels PX, discharge points of ink, etc.

Figure 20:
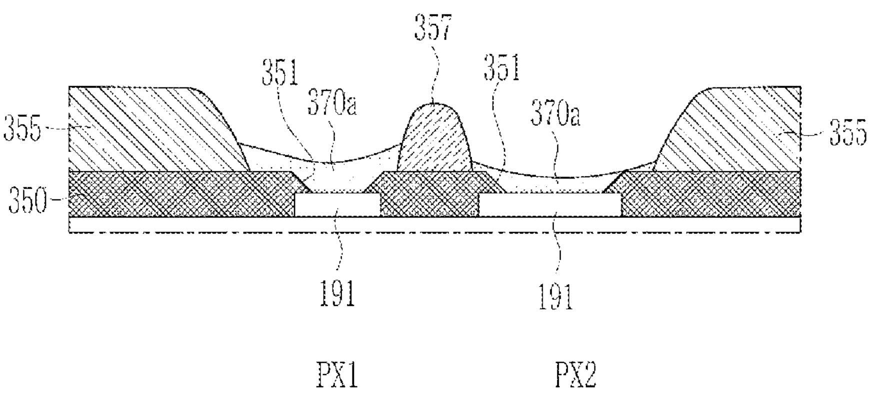

When the ink separated into each pixel opening 351 is dried, the electron injection layer 370*a* may be disposed on the pixel electrode 191 as illustrated in FIG. 20. After the electron injection layer 370*a* is formed, the electron transport layer 370*b* may be formed in a same manner. Next, after forming the individual emission layer 370*c* by the process method shown in FIG. 14 to FIG. 16, the hole transport layer 370*d* and the hole injection layer 370*e* may be sequentially formed by the process method illustrated in FIG. 17 to FIG. 20.

The common layers 370*a*, 370*b*, 370*d*, and 370*e* positioned in the first pixel PX1 and the common layers 370*a*, 370*b*, 370*d*, and 370*e* positioned in the second pixel PX2 may be made of a same material. Similarly, the common layers 370*a*, 370*b*, 370*d*, and 370*e* positioned in the first pixel PX1, the second pixel PX2, the third pixel PX3, and the fourth pixel PX4 that are positioned in the pixel group PXGr may be made of a same material.

A thickness of the common layers 370*a*, 370*b*, 370*d*, and 370*e* positioned in the first pixel PX1 may be different from that of the common layers 370*a*, 370*b*, 370*d*, and 370*e* positioned in the second pixel PX2. The thickness of the common layers 370*a*, 370*b*, 370*d*, and 370*e* positioned in the first pixel PX1 may be thicker than that of the common layers 370*a*, 370*b*, 370*d*, and 370*e* positioned in the second pixel PX2. Similarly, a thickness of the common layers 370*a*, 370*b*, 370*d*, and 370*e* positioned in the third pixel PX3 may be different from that of the common layers 370*a*, 370*b*, 370*d*, and 370*e* positioned in the fourth pixel PX4. The thickness of the common layers 370*a*, 370*b*, 370*d*, and 370*e* positioned in the second pixel PX2 may be substantially the same as that of the common layers 370*a*, 370*b*, 370*d*, and 370*e* positioned in the third pixel PX3. The thickness of the common layers 370*a*, 370*b*, 370*d*, and 370*e* of the plurality of pixels PX positioned in the pixel group PXGr may be adjusted by controlling the positions of the pixels PX constituting the pixel group PXGr, the size of the pixel opening 351 of each of the pixels PX, the discharge points of ink, etc. However, the present invention is not limited thereto, and the thicknesses of the common layers 370*a*, 370*b*, 370*d*, and 370*e* of the pixels PX positioned in the pixel group PXGr may be adjusted to be the same.

Hereinafter, a thickness of an emission layer of pixels constituting each pixel group will be described with reference to FIG. 21.

Figure 21:
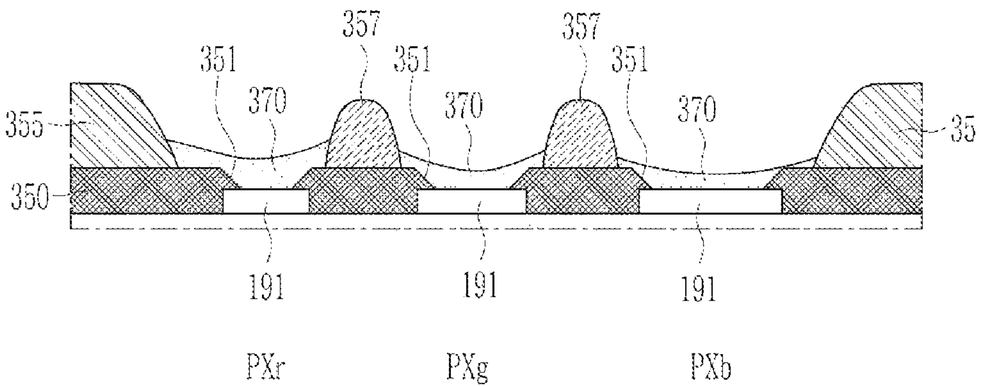
FIG. 21 illustrates a cross-sectional view showing some layers of a display device according to an embodiment.

FIG. 21 illustrates a cross-sectional view showing some layers of a display device according to an embodiment.

As illustrated in FIG. 21, each pixel group PXGr may include a red pixel PXr, a green pixel PXg, and a blue pixel PXb. The emission layers 370 respectively positioned in the red pixel PXr, the green pixel PXg, and the blue pixel PXb may have different thicknesses. The thickness of the emission layer 370 positioned in the red pixel PXr may be greater than that of the emission layer 370 positioned in the green pixel PXg. The thickness of the emission layer 370 positioned in the green pixel PXg may be greater than that of the emission layer 370 positioned in the blue pixel PXb. However, the embodiments described herein are not limited thereto, and the thickness of the emission layer 370 positioned in each of the red pixel PXr, the green pixel PXg, and the blue pixel PXb constituting the pixel group PXGr may be constant.

Hereinafter, a display device according to an embodiment will be described with reference to FIG. 22.

Figure 22:
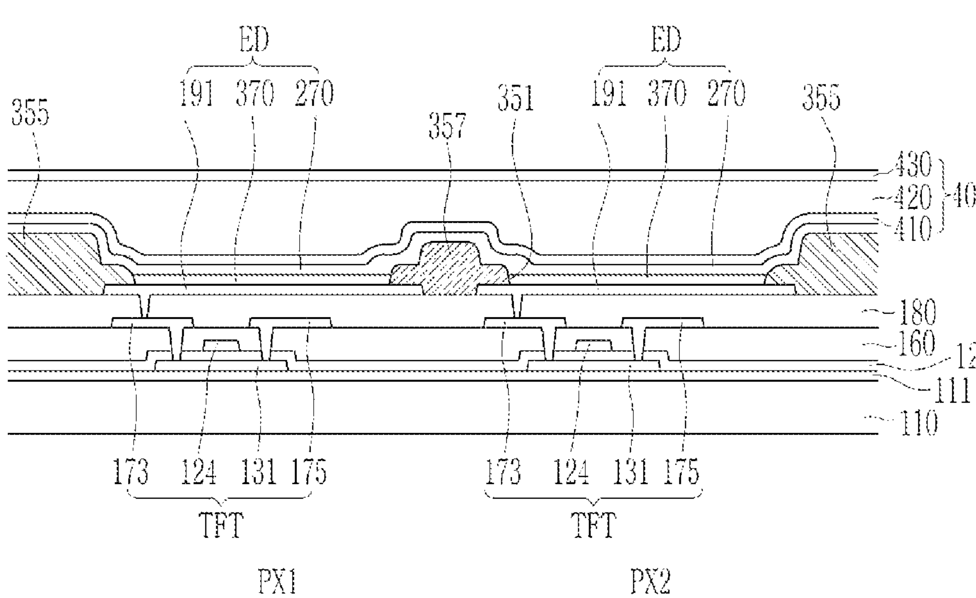
FIG. 22 illustrates a cross-sectional view showing a display device according to an embodiment

Since the display device according to the embodiment illustrated in FIG. 22 is substantially the same as the display device according to the embodiment shown in FIG. 1 to FIG. 4, a description of the same parts will be omitted for ease in explanation of FIG. 22. The embodiment described with reference to FIG. 22 is different from the previously-described embodiments in that the lower partition wall and the outer partition wall are integrally formed, and the lower partition wall and the inner partition wall are integrally formed, which will be further described below.

FIG. 22 illustrates a cross-sectional view showing a display device according to an embodiment As illustrated in FIG. 22, the display device according to the present embodiment may include a substrate 110, a semiconductor 131 positioned on the substrate 110, a transistor (TFT) including a gate electrode 124, a source electrode 173, and a drain electrode 175, a gate insulating layer 120, an interlayer insulating layer 160, a passivation layer 180, a pixel electrode 191, an emission layer 370, an outer partition wall 355, an inner partition wall 357, a common electrode 270, and an encapsulation layer 400.

The outer partition wall 355 and the inner partition wall 357 may be positioned on the pixel electrode 191. In the previously-described embodiment, the outer partition wall 355 and the inner partition wall 357 may be positioned on the lower partition wall, and in the embodiment, the lower partition wall may not be separately formed. The lower partition wall and the outer partition wall 355 may be integrally formed, and the lower partition wall and the inner partition wall 357 may be integrally formed.

The inner partition wall 357 is surrounded by the outer partition wall 355. The inner partition wall 357 may be positioned at a boundary between the first pixel PX1 and the second pixel PX2, and the outer partition wall 355 may have a shape surrounding the pixel group PXGr. The thickness of the outer partition wall 355 may be greater than that of the inner partition wall 357. The outer partition wall 355 and the inner partition wall 357 may each be formed of a liquid-repellent material. The outer partition wall 355 may include a different material from that of the inner partition wall 357. The outer partition wall 355 and the inner partition wall 357 may be formed by using different processes.

The emission layer 370 may be positioned within the pixel opening 351 partitioned by the outer partition wall 355 and the inner partition wall 357.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:

a substrate;

a plurality of first electrodes positioned on the substrate;

a lower partition wall configured to include a plurality of pixel openings that overlap the plurality of first electrodes;

an outer partition wall positioned on at least a portion of the lower partition wall;

an inner partition wall positioned on another portion of the lower partition wall;

an emission layer disposed on each of the first electrodes; and a second electrode disposed on the emission layer; wherein the substrate includes a pixel group including a plurality of pixels, the emission layer is disposed in each of the pixels, the emission layer in a pixel is spaced apart in a first direction and a second direction in a plan view from the emission layer in adjacent pixels in the pixel group by the inner partition wall, and the outer partition wall and the inner partition wall do not overlap each other in a third direction perpendicular to the first direction and the second direction.

2. The display device of claim 1, wherein the inner partition wall is surrounded by the outer partition wall.

3. The display device of claim 2, wherein the outer partition wall includes a material that is different from a material of the inner partition wall.

4. The display device of claim 3, wherein surface energy of the outer partition wall is lower than surface energy of the inner partition wall.

5. The display device of claim 3, wherein a contact angle of the outer partition wall is higher than a contact angle of the inner partition wall.

6. The display device of claim 5, wherein the contact angle of the outer partition wall is 50 degrees or more, and the contact angle of the inner partition wall is greater than or equal to 40 degrees and less than 50 degrees.

7. The display device of claim 2, wherein a thickness of the outer partition wall is thicker than a thickness of the inner partition wall.

8. The display device of claim 2, wherein the outer partition wall has a shape surrounding the pixel group, and the inner partition wall is positioned between the pixels positioned in the pixel group.

9. The display device of claim 8, wherein the outer partition wall is formed to have a rectangular shape in a plan view, and the inner partition wall is formed to have a cross shape in a plan view.

10. The display device of claim 8, wherein the emission layer includes:

an individual emission layer, and a common layer positioned at an upper side or a lower side of the individual emission layer.

* * * * *